United States Patent
Ko et al.

(10) Patent No.: US 10,553,686 B2
(45) Date of Patent: Feb. 4, 2020

(54) METHOD AND APPARATUS FOR FORMING SILICON OXIDE FILM, AND STORAGE MEDIUM

(71) Applicant: TOKYO ELECTRON LIMITED, Tokyo (JP)

(72) Inventors: Kyungseok Ko, Gyeonggi-do (KR); Hiromi Shima, Nirasaki (JP); Eiji Kikama, Nirasaki (JP); Shingo Hishiya, Nirasaki (JP)

(73) Assignee: TOKYO ELECTRONC LIMITED, Tokyo (JP)

( * ) Notice: Subject to any disclaimer, the term of this patent is extended or adjusted under 35 U.S.C. 154(b) by 0 days.

(21) Appl. No.: 16/126,195

(22) Filed: Sep. 10, 2018

(65) Prior Publication Data
US 2019/0080913 A1   Mar. 14, 2019

(30) Foreign Application Priority Data

Sep. 13, 2017   (JP) .................. 2017-175425

(51) Int. Cl.
| | |
|---|---|
| *H01L 21/28* | (2006.01) |
| *H01L 21/02* | (2006.01) |
| *H01L 21/311* | (2006.01) |
| *C23C 16/455* | (2006.01) |
| *C23C 16/34* | (2006.01) |
| *C23C 16/40* | (2006.01) |
| *C23C 16/56* | (2006.01) |
| *H01L 27/11582* | (2017.01) |

(52) U.S. Cl.
CPC ...... *H01L 29/40117* (2019.08); *C23C 16/345* (2013.01); *C23C 16/401* (2013.01); *C23C 16/45527* (2013.01); *C23C 16/56* (2013.01); *H01L 21/0217* (2013.01); *H01L 21/0223* (2013.01); *H01L 21/0228* (2013.01); *H01L 21/02164* (2013.01); *H01L 21/02211* (2013.01); *H01L 21/02255* (2013.01); *H01L 27/11582* (2013.01); *H01L 21/31116* (2013.01)

(58) Field of Classification Search
CPC ................................. H01L 21/28282
See application file for complete search history.

(56) References Cited

U.S. PATENT DOCUMENTS

2015/0155297 A1* 6/2015 Eom ................. H01L 27/11582
                                                                    438/268
2017/0271527 A1* 9/2017 Higuchi ............. H01L 29/7923

FOREIGN PATENT DOCUMENTS

JP          2017117977 A     6/2017

* cited by examiner

*Primary Examiner* — William A Harriston
(74) *Attorney, Agent, or Firm* — Nath, Goldberg & Meyer; Jerald L. Meyer

(57) ABSTRACT

There is provided a method of forming a silicon oxide film on a target surface on which a silicon oxide film and a silicon nitride film are exposed. The method comprises placing a workpiece having the target surface on which the silicon oxide film and the silicon nitride film are exposed, in a processing container under a depressurized atmosphere; forming a spacer silicon nitride film to be a sacrificial film on the target surface on which the silicon oxide film and the silicon nitride film are exposed; and substituting the spacer silicon nitride film with a substitution silicon oxide film by supplying thermal energy, oxygen radicals and hydrogen radicals onto the workpiece.

16 Claims, 14 Drawing Sheets

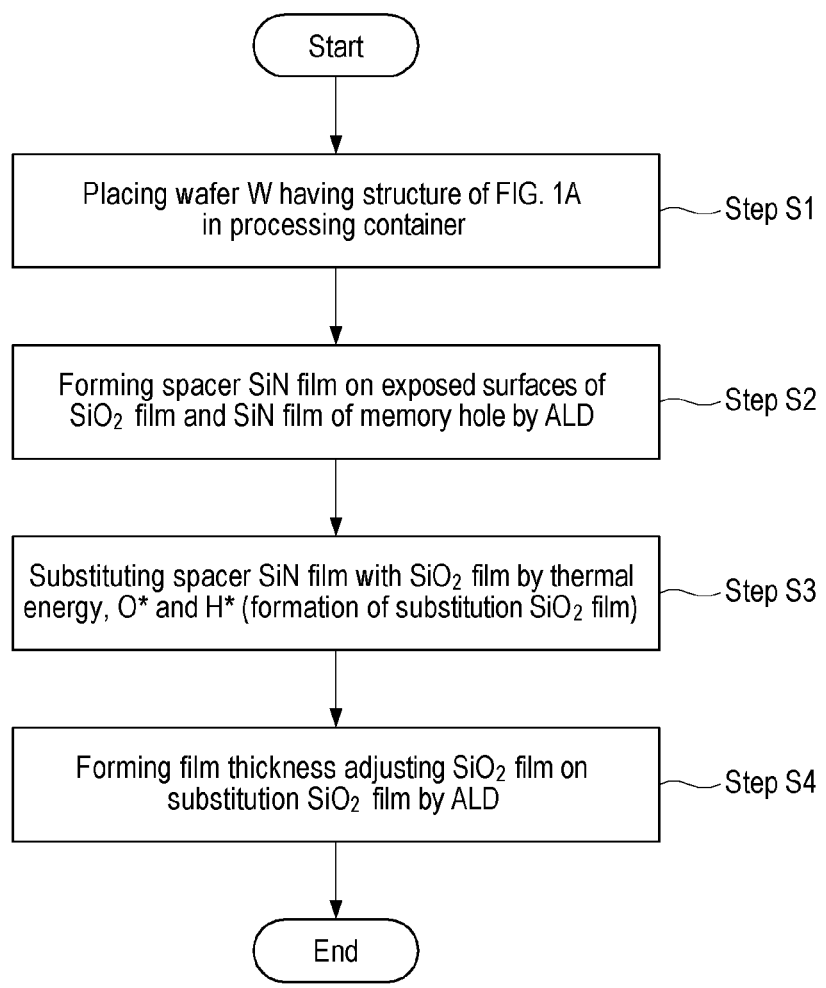

METHOD AND APPARATUS FOR FORMING SILICON OXIDE FILM, AND STORAGE MEDIUM

CROSS-REFERENCE TO RELATED APPLICATION

This application is based upon and claims the benefit of priority from Japanese Patent Application No. 2017-175425, filed on Sep. 13, 2017, the entire contents of which are incorporated herein by reference.

TECHNICAL FIELD

The present disclosure relates to a method and apparatus for forming a silicon oxide film on a target surface on which a silicon oxide film and a silicon nitride film are exposed, and a storage medium.

BACKGROUND

For example, in a process of manufacturing a 3D-NAND type nonvolatile semiconductor device, a laminated film including a plurality of silicon oxide films ($SiO_2$ films) and a plurality of silicon nitride films (SiN films) alternately laminated is formed, a memory hole (channel hole) is formed in the laminating direction, a $SiO_2$ film, a SiN film and a $SiO_2$ film are sequentially formed in the memory hole by CVD, ALD or the like, a polysilicon film is formed, and then the center part of the memory hole is filled with a $SiO_2$ film to form a channel part. Thereafter, a trench is formed in the laminating direction of the laminated film, the SiN film is removed by wet etching through the trench, a tungsten film to be a gate electrode is buried in a space generated after the removal of the SiN film via a TiN film, and the trench is filled with an $SiO_2$ film or the like.

In recent years, as the design rule of semiconductor devices has been increasingly miniaturized, there is a need to form a thin and uniform $SiO_2$ film on the surface of a laminated film of a $SiO_2$ film and a SiN film in which a memory hole is formed, by CVD or ALD.

However, when the $SiO_2$ film is formed on the surface of the laminated film of the $SiO_2$ film and the SiN film by CVD or ALD, since the SiN film in the laminated film is more likely to diffuse oxygen than the $SiO_2$ film to generate a grown oxide in the SiN film, the formed $SiO_2$ film is thicker at the $SiO_2$ film portion of the laminated film and is thinner at the SiN film portion, which makes it difficult to form a thin and uniform $SiO_2$ film.

SUMMARY

Some embodiments of the present disclosure provide a technique capable of forming a silicon oxide film having a thin and uniform thickness on a target surface on which a silicon oxide film and a silicon nitride film are exposed.

According to one embodiment of the present disclosure, there is provided a method of forming a silicon oxide film on a target surface on which a silicon oxide film and a silicon nitride film are exposed, including: placing a workpiece having the target surface on which the silicon oxide film and the silicon nitride film are exposed, in a processing container under a depressurized atmosphere; forming a spacer silicon nitride film to be a sacrificial film on the target surface on which the silicon oxide film and the silicon nitride film are exposed; and substituting the spacer silicon nitride film with a substitution silicon oxide film by supplying thermal energy, oxygen radicals and hydrogen radicals onto the workpiece.

According to another embodiment of the present disclosure, there is provided an apparatus for forming a silicon oxide film on a target surface on which a silicon oxide film and a silicon nitride film are exposed, including: a processing container in which a workpiece having the target surface on which the silicon oxide film and the silicon nitride film are exposed is accommodated; a gas supply part configured to supply a predetermined gas into the processing container; a heating mechanism configured to heat an interior of the processing container; an exhaust mechanism configured to exhaust the interior of the processing container to bring the processing container into a depressurized state; and a controller configured to control the gas supply part, the heating mechanism and the exhaust mechanism, wherein the controller controls the gas supply part, the heating mechanism and the exhaust mechanism to perform a process including: keeping the interior of the processing container under a predetermined depressurized atmosphere in a state where the workpiece is placed in the processing container; forming a spacer silicon nitride film to be a sacrificial film on the target surface on which the silicon oxide film and the silicon nitride film are exposed by supplying a silicon precursor gas and a nitriding gas; and substituting the spacer silicon nitride film with a substitution silicon oxide film by supplying thermal energy, oxygen radicals and hydrogen radicals onto the workpiece.

According to another embodiment of the present disclosure, there is provided a non-transitory computer-readable storage medium storing a program that is operated on a computer and controls an apparatus for forming a silicon oxide film on a target surface on which a silicon oxide film and a silicon nitride film are exposed, wherein the program is executed to cause the computer to control the apparatus to perform the method of forming a silicon oxide film on a target surface.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a flow chart showing a method of forming a silicon oxide film according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Application Example of Silicon Oxide Film Forming Method

Figure 1A:
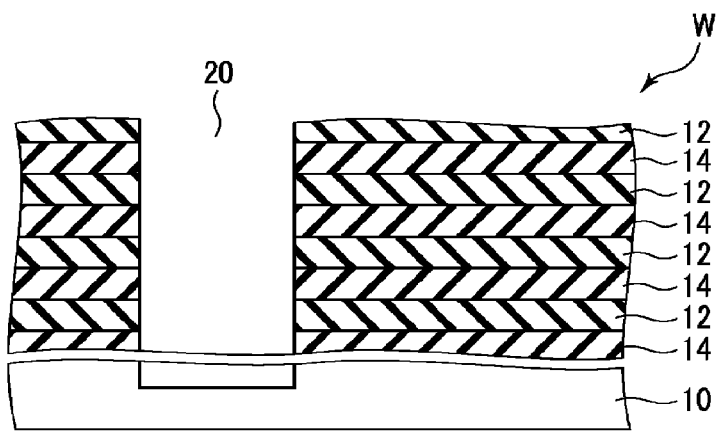
FIGS. 1A to 1C are cross-sectional process views showing a process of manufacturing a 3D-NAND type nonvolatile semiconductor device to which a method of forming a silicon oxide film according to an embodiment of the present disclosure is applied.
Figure 1B:
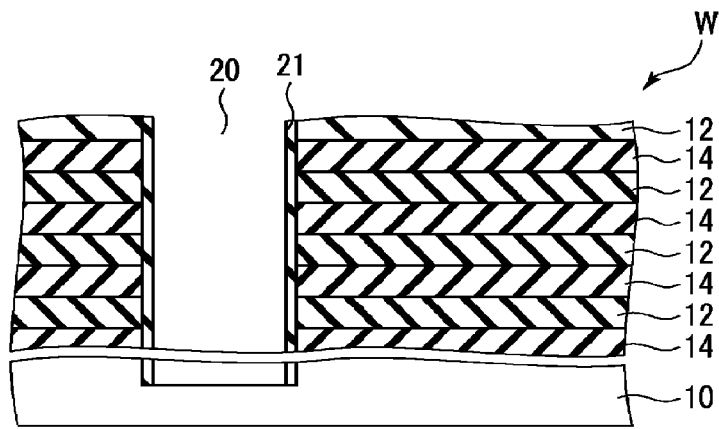
Figure 1C:
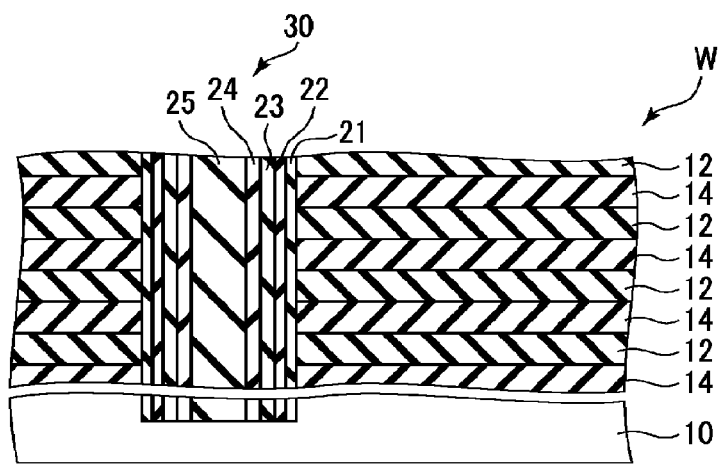

First, an application example of a method of forming a silicon oxide film according to an embodiment of the present disclosure will be described. FIGS. 1A to 1C are cross-sectional process views showing a process of manufacturing a 3D-NAND type nonvolatile semiconductor device to which a method of forming a silicon oxide film according to an embodiment of the present disclosure is applied.

FIG. 1A shows a semiconductor wafer W as a workpiece in a state where a plurality of SiO$_2$ films 12, which are insulating films, and a plurality of SiN films 14, which are sacrificial films, are alternately laminated on a semiconductor substrate (silicon substrate) 10 to form a laminated body and a memory hole 20 penetrating up to the semiconductor substrate 10 in the laminating direction is formed.

In this state, a blocking oxide film 21, which is a silicon oxide film of this embodiment, is formed on the target surface of the SiO$_2$ films 12 and the SiN films 14 which are exposed in the memory hole 20 (FIG. 1B).

Subsequent to the formation of the blocking oxide film 21, a charge accumulation layer 22 formed of a SiN film, a tunnel oxide film 23 formed of a SiO$_2$ film, and a channel body 24 made of polysilicon are formed, and a hole portion remaining at the center of the memory hole 20 is filled with a core insulation film 25 to form a memory part 30 (FIG. 1C).

Figure 2A:
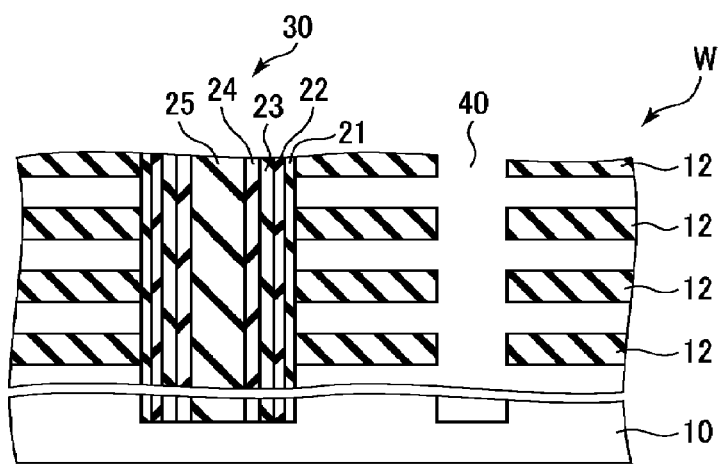
FIGS. 2A to 2C are cross-sectional process views showing a process of manufacturing a 3D-NAND type nonvolatile semiconductor device to which a method of forming a silicon oxide film according to an embodiment of the present disclosure is applied.
Figure 2B:
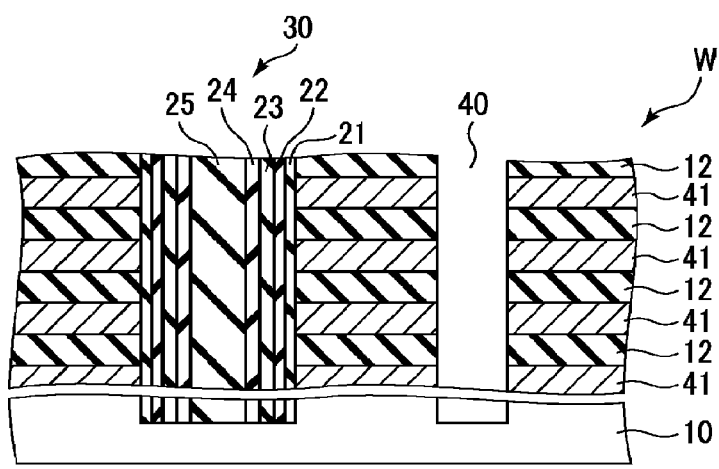
Figure 2C:
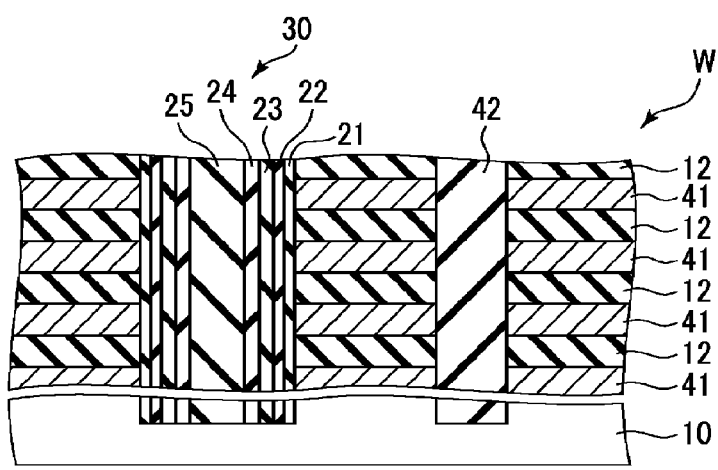

Next, a trench 40 is formed in the laminating direction and the SiN films 14 as the sacrificial films are etched and removed through the trench 40 (FIG. A). Next, blocking Al$_2$O$_3$ films (not shown) and TiN films (not shown) serving as a barrier film are formed in spaces obtained by etching and removing the SiN films 14, and the spaces are filled with tungsten films 41 serving as gate electrodes (FIG. 2B). Next, the trench 40 is filled with a silicon oxide film 42 (FIG. 2C).

<Method of Forming Blocking Oxide Film>

Next, a method of forming a silicon oxide film (blocking oxide film 21) according to an embodiment of the present disclosure, which is performed in the above-described 3D-NAND type nonvolatile semiconductor device manufacturing process, will be described. The blocking oxide film 21 is provided to prevent the charge accumulation layer 22 formed of the SiN film from being etched when e SiN films 14 as the sacrificial films are removed by wet etching.

FIG. 3 is a flow chart showing a method of forming a silicon oxide film (blocking oxide film 21) according to an embodiment of the present disclosure, and FIGS. 4A to 4D are cross-sectional process views at that time.

First, a wafer W having the structure of FIG. 1A is placed in a processing container (step S1). The interior of the processing container is brought into a depressurized state.

Figure 4A:
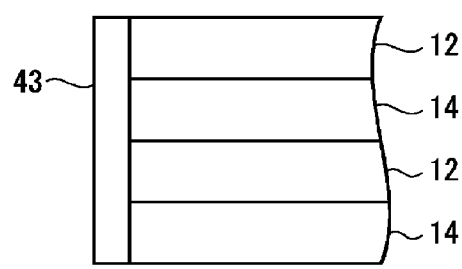
FIGS. 4A to 4D are cross-sectional process views showing a method of forming a silicon oxide film according to an embodiment of the present disclosure.

Next, a spacer SiN film (sacrificial film) 43 is formed on the exposed surfaces of the SiO$_2$ films 12 and the SiN films 14 in the memory hole 20 (Step S2, FIG. 4A).

The spacer SiN film 43 may be formed by ALD. For the film formation by ALD, a Si precursor gas and a nitriding gas are alternately supplied into the processing container kept in a vacuum state, with purging interposed therebetween, and the adsorption and nitration of the Si precursor are repeated. The purging is a process of supplying a rare gas such as an Ar gas or an inert gas such as a N$_2$ gas into the processing container to discharge a residual gas in the previous process from the processing container.

As the Si precursor, chlorine-containing silicon-based compounds such as dichlorosilane (DCS; SiH$_2$Cl$_2$), monochlorosilane (MCS: SiClH$_3$), trichlorosilane (TCS; SiHCl$_3$), silicon tetrachloride (STC: SiCl$_4$), hexachlorodisilane (HCD; Si$_2$Cl$_6$) and the like can be suitably used. Among these, HCD is preferably used.

As the nitriding gas, an ammonia (NH$_3$) gas, a hydrazine (N$_2$H$_4$) gas, a derivative thereof, for example, a monomethyl hydrazine (MMH) gas, or the like may be used.

The temperature at this time may be 600 to 680 degrees C., for example, 630 degrees C. The pressure may be 0.5 to 10 Torr (66.7 to 1333 Pa).

A film thickness of the spacer SiN film 43 is required to be thin enough to perform the sufficient substitution reaction in the next process, preferably about 1 to 4 nm. The supply time of Si precursor per one time in ALD may be 0.5 to 10 min, the supply time of nitriding gas may be 1 to 10 min, and the number of repetitions of supply for obtaining the above thickness may be about 10 to 50.

Next, the spacer SiN film 43 is substituted with a SiO$_2$ film by thermal energy, oxygen radicals (O*) and hydrogen radicals (H*) (step S3). At this time, it is considered that the substitution reaction shown in the following formula (1) occurs due to the thermal energy, O* and H*, thereby substituting the SiN film with the SiO$_2$ film.

$$Si_3N_4 + 6H_2O \rightarrow 3SiO_2 + N_2O + 4NH_3 \ldots \quad (1)$$

Figure 4B:
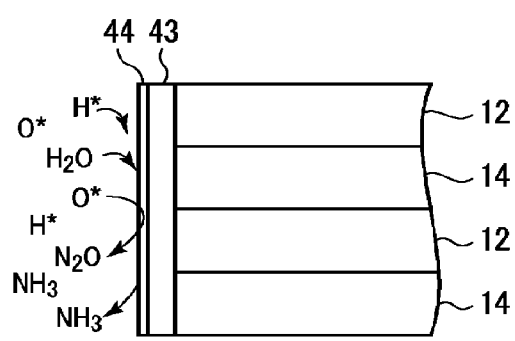
Figure 4C:
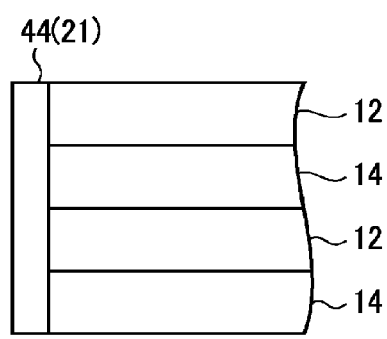

That is, Si—N bonds are substituted with Si—O bonds using the thermal energy, O* and H*. Specifically, preferably, while setting the internal pressure of the processing container to 0.5 to 10 Torr (66.7 to 1,333 Pa) and heating the wafer W to a high temperature of 800 to 900 degrees C. to apply thermal energy, an $O_2$ gas and a $H_2$ gas are supplied into the processing container to generate O* and H* with the principle of low pressure radical oxidation (LPRO). As shown in FIG. 4B, when these generated O* and H* are supplied to the spacer SiN film 43, the spacer SiN film 43 is partially substituted with $SiO_2$ in the spacer SiN film 43 by thermal energy and radicals in accordance with the above-described formula (1) to form a substitution $SiO_2$ film 44, and a $N_2O$ gas and a $NH_3$ gas are generated. Finally, as shown in FIG. 4C, the entire spacer SiN film 43 is substituted with the substitution $SiO_2$ film 44 (formation of the substitution $SiO_2$ film 44). At this time, the substitution $SiO_2$ film 44 is somewhat thicker than the spacer SiN film 43. For example, the spacer SiN film 43 having a thickness of 4 nm becomes the substitution $SiO_2$ film 44 having a thickness of about 5 nm.

Actually, after forming a spacer SiN film with a thickness of 3 nm and subjecting it to substitution treatment by the above method, element analysis was performed by SIMS. The result showed that the spacer SiN film was almost completely substituted with a $SiO_2$ film.

Figure 4D:
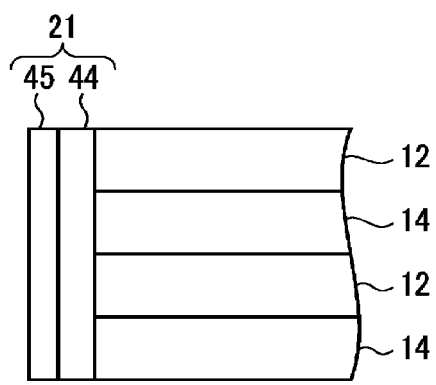

Next, a film thickness adjusting $SiO_2$ film 45 is formed (step S4, FIG. 4D). The film thickness adjusting $SiO_2$ film 45 is provided to adjust the film thickness of the blocking oxide film 21 and may be formed by ALD. That is, the spacer SiN film 43 is formed to be thin from the viewpoint of complete substitution with $SiO_2$ film and from the viewpoint of film thickness adjustability, the spacer SiN film 43 is changed to the substitution $SiO_2$ film 44 by the substitution reaction, and then an insufficient film thickness is supplemented with the film thickness adjusting $SiO_2$ film 45 to form the blocking oxide film 21 having a predetermined thickness.

When forming the film thickness adjusting $SiO_2$ film 45 by ALD, a Si precursor gas and an oxidizing agent containing oxidizing species are alternately supplied into the processing container, with purging interposed therebetween, and the adsorption and oxidation of the Si precursor gas are repeated. The purging is a process of supplying a rare gas such as an Ar gas or an inert gas such as a $N_2$ gas into the processing container to discharge a residual gas in the previous process from the processing container.

At this time, the film formation by ALD may be performed by the following two methods. The first method is to use low pressure radical oxidation (LPRO) and the second method is to use an ozone ($O_3$) gas as an oxidizing agent.

In the first method, an $O_2$ gas and a $H_2$ gas are radicalized at a high temperature of 700 to 750 degrees C. to generate oxygen radicals (O*) and hydrogen radicals (H*), which are used as oxidizing agents. At this time, the ratio of $O_2$ gas flow rate/($O_2$ gas+$H_2$ gas flow rate) may be 50 to 90%. According to the first method, it is possible to form a $SiO_2$ film having good film quality and obtain good wet-etching resistance.

In the second method, a $SiO_2$ film is formed at a temperature of 600 degrees C. to 650 degrees C. by using the $O_3$ gas as an oxidizing agent. Since no hydrogen is used, a $SiO_2$ film containing less hydrogen in the film can be obtained. Although the wet etching resistance to the $SiO_2$ film is inferior to that by the first method, the dry etching resistance to the $SiO_2$ film is high, which is advantageous when dry etching is included in subsequent processes.

In both of the first and second methods, the pressure may be 1 to 10 Torr (133 to 1,333 Pa) and the film thickness may be 20 nm or less. As the Si precursor, a chlorine-containing silane-based compound, a silane-based compound or, an aminosilane-based compound may be used. Among these Si— precursors, the chlorine-containing silane-based compound is preferably used. As the chlorine-containing silane-based compound, DCS, MCS, TCS, STC or HCD may be used. Among these chlorine-containing silane-based compounds, HCD is preferably used.

When the thickness of the substitution $SiO_2$ film 44 is sufficient for the blocking oxide film 21, the blocking oxide film 21 can be formed only with the substitution $SiO_2$ film 44, eliminating a need to provide the film thickness adjusting $SiO_2$ film 45.

Figure 5A:
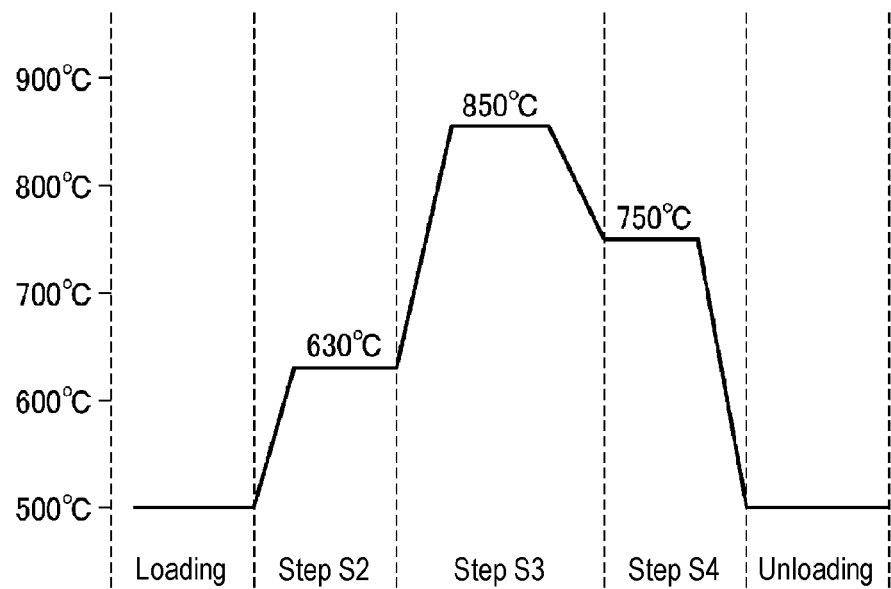
FIGS. 5A and 5B are views showing an example of a temperature flowchart of a method of forming a silicon oxide film according to an embodiment of the present disclosure.
Figure 5B:
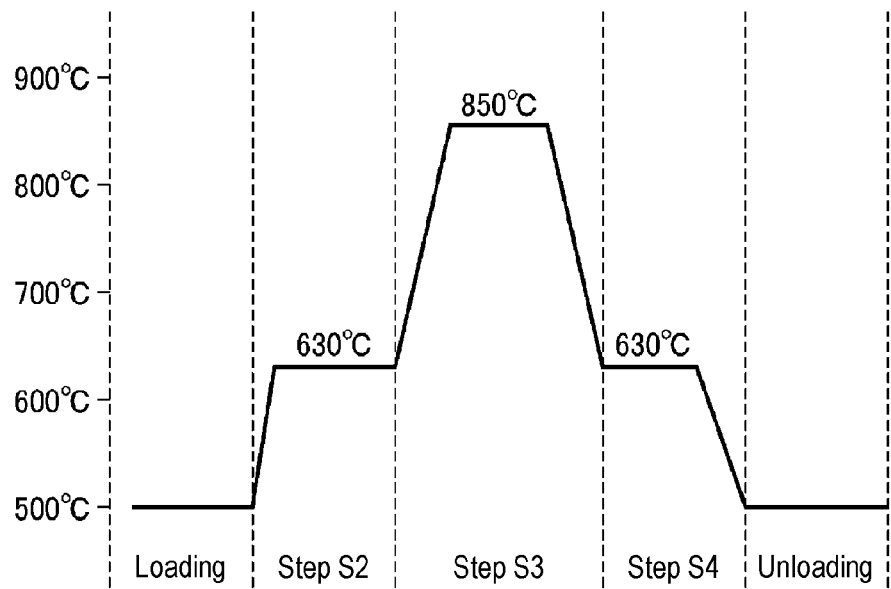

The blocking oxide film 21 is formed by the above steps S1 to S4. FIGS. 5A and 5B show a temperature flowchart of the steps S2 to S4 at this time. FIG. 5A shows a case where the first method is adopted in the step S4 and FIG. 5B shows a case where the second method is adopted in the step S4. The steps S2 to S4 are preferably performed in-situ, although there is a change in temperature.

Figure 6:
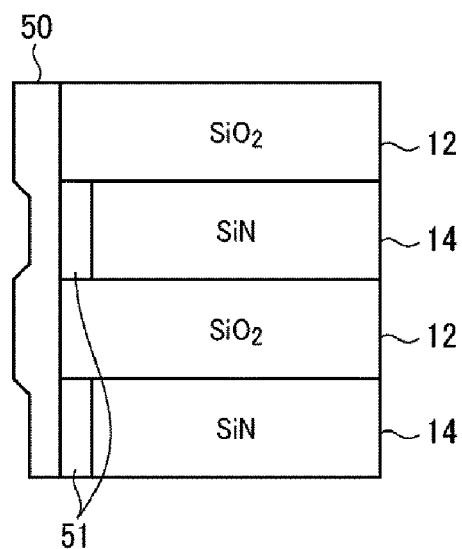
FIG. 6 is a cross-sectional view showing a state in which a SiO$_2$ film serving as a blocking oxide film is directly formed on the surfaces of a SiO$_2$ film and a SiN film by ALD.

When a $SiO_2$ film 50 to be a blocking oxide film is directly formed on the surfaces of the $SiO_2$ film 12 and the SiN film 14 by ALD as shown in FIG. 6, oxygen is more likely to diffuse to the SiN film 14 than to the $SiO_2$ film. Therefore, as shown in FIG. 6, since a grown oxide 51 is generated in the SiN film 14, the $SiO_2$ film formed is thicker in the $SiO_2$ film 12 portion and thinner in the SiN film 14 portion, which makes it difficult to form an $SiO_2$ film 50 to be a blocking oxide film with a thin and uniform film thickness.

In contrast, in the present embodiment, first, since the spacer SiN film 43 is formed on the surfaces of the $SiO_2$ film 12 and the SiN film 14, a grown oxide is not generated, and a thin and uniform film can be formed. Then, since this spacer SiN film 43 is subjected to radical treatment with O* and H* at a high temperature to cause the substitution reaction from SiN to $SiO_2$, the substitution $SiO_2$ film 44 can be formed while maintaining a thin and uniform film thickness. The blocking oxide film 21 formed of the substitution $SiO_2$ film 44 and optionally the film thickness adjusting $SiO_2$ film 45 formed by ALD or the like can be uniformly formed with a desired thin film thickness.

In addition, by using the film thickness adjusting the $SiO_2$ film 45, it is possible to form a blocking oxide film 21 having a desired film thickness after reliably substituting the spacer SiN film 43 formed as thin as possible with a $SiO_2$ film.

<Processing Apparatus>

Next, a processing apparatus for implementing the method of forming a silicon oxide film (blocking oxide film) according to the above embodiment will be described.

FIRST EXAMPLE OF PROCESSING APPARATUS

Figure 7:
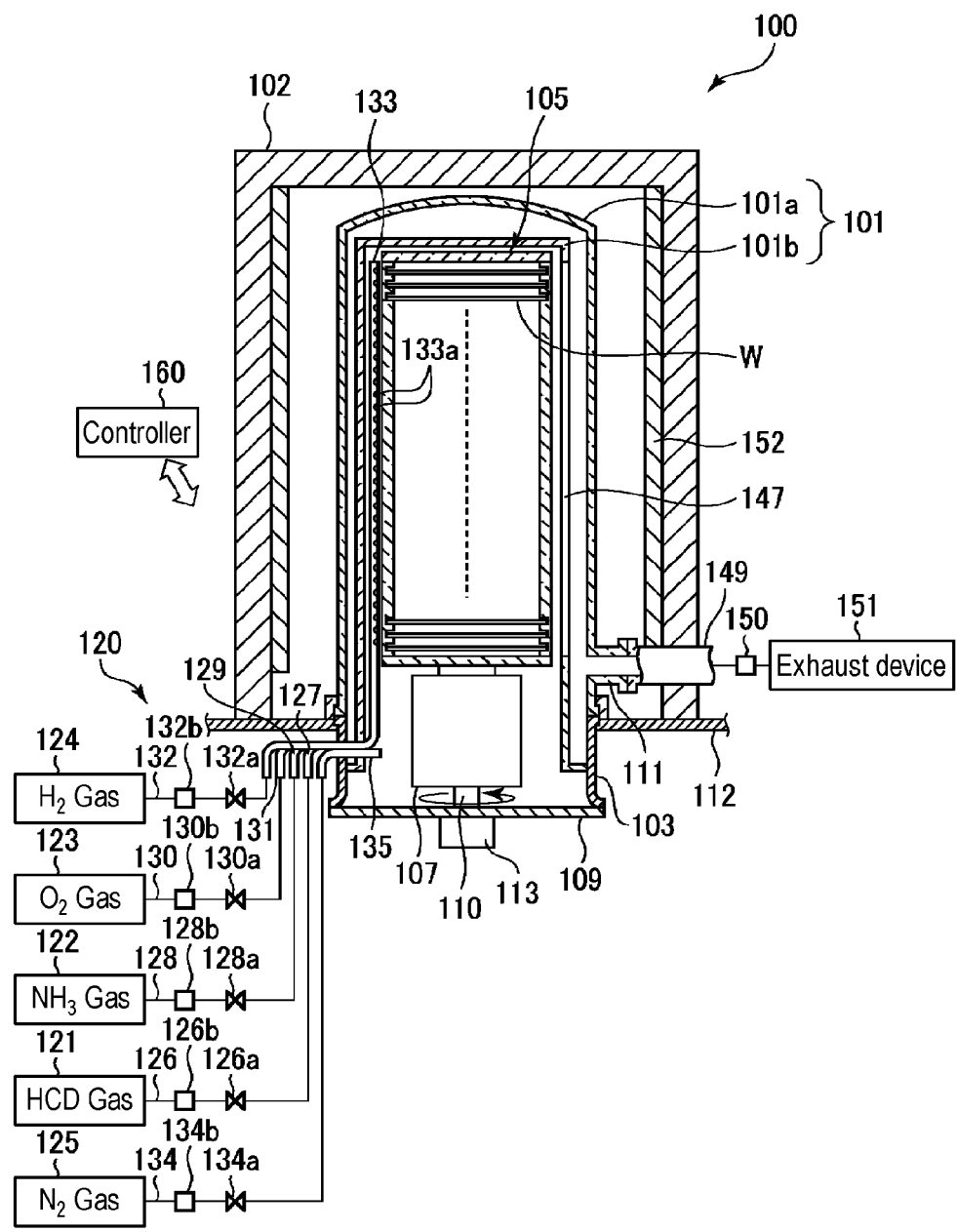
FIG. 7 is a longitudinal sectional view showing a first example of a processing apparatus capable of performing a method of forming a silicon oxide film according to the present disclosure.
Figure 8:
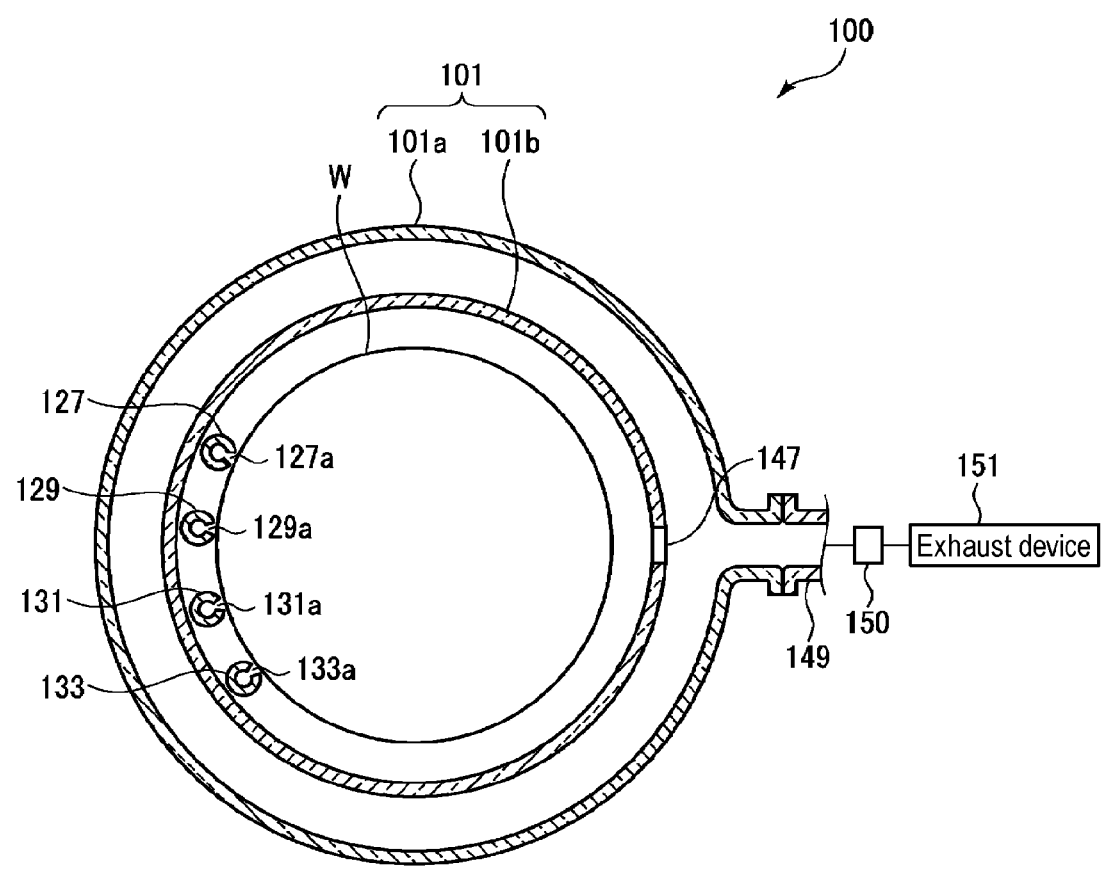
FIG. 8 is a horizontal sectional view showing a first example of a processing apparatus capable of performing a method of forming a silicon oxide film according to the present disclosure.

First, a description will be given of a first example of a processing apparatus capable of performing the step S4 by the first method. FIG. 7 is a longitudinal sectional view showing a first example of the processing apparatus. FIG. 8 is a horizontal sectional view of the first example of the processing apparatus.

The processing apparatus 100 of this example is configured as a heating furnace which is a hot-wall type film forming apparatus, and includes a processing container 101 that has a ceiling and is configured as a reaction tube having a dual-tube structure composed of an outer tube 101a and an inner tube 101b. The processing container 101 is entirely made of, e.g., quartz. A quartz wafer boat 105 on which 50 to 150 wafers W are placed in multiple stages is disposed in the inner tube 101b of the processing container 101. A substantially cylindrical main body section 102 with its lower surface side opened is installed on the outer side of the processing container 101, and a heating mechanism 152 having a heater is installed on the inner wall surface of the main body section 102 over the circumference. The main body section 102 is supported by a base plate 112.

A manifold 103 molded into a cylindrical shape by, for example, stainless steel is connected to a lower end opening portion of the outer tube 101a of the processing container 101 via a seal member (not shown) such as an O-ring or the like.

The manifold 103 supports the outer tube 101a of the processing container 101. The wafer boat 105 is inserted into the inner tube 101b of the processing container 101 from below the manifold 103. The bottom of the manifold 103 is closed by a lid 109.

The wafer boat 105 is placed on a heat insulating barrel 107 made of quartz. A rotating shaft 110 is attached to the heat insulating barrel 107 while penetrating through the lid 109. The rotating shaft 110 can be rotated by a rotation driving mechanism 113 such as a motor or the like. Thus, the wafer boat 105 can be rotated via the heat insulating barrel 107 by the rotation driving mechanism 113. Incidentally, the heat insulating barrel 107 may be installed to be fixed on the lid 109 to process the wafers W without rotating the wafer boat 105.

The processing apparatus 100 has a gas supply mechanism 120 for supplying various kinds of gases. The gas supply mechanism 120 includes a HCD gas supply source 121 for supplying a HCD gas, a $NH_3$ gas supply source 122 for supplying a $NH_3$ gas, an $O_2$ gas supply source 123 for supplying an 2 gas, a $H_3$ gas supply source 124 for supplying a $H_2$ gas, and a $N_2$ gas supply source 125 for supplying a $N_2$ gas which is an inert gas.

A pipe 126 is connected to the HCD gas supply source 121 and is also connected with a gas dispersion nozzle 127 made of quartz, which penetrates through the side walls of the manifold 103 and the inner tube 101b of the processing container 10 and is bent upward and extends vertically in the inner tube 101b. A pipe 128 is connected to the $NH_3$ gas supply source 122 and is also connected with a gas dispersion nozzle 129 made of quartz, which penetrates through the side walls of the manifold 103 and the inner tube 101b and is bent upward and extends vertically in the inner tube 101b. A pipe 130 is connected to the $O_2$ gas supply source 123 and is also connected with a gas dispersion nozzle 131 made of quartz, which penetrates through the side walls of the manifold 103 and the inner tube 101b and is bent upward and extends vertically in the inner tube 101b. A pipe 132 is connected to the $H_2$ gas supply source 124 and is also connected with a gas dispersion nozzle 133 made of quartz, which penetrates through the side walls of the manifold 103 and the inner tube 101b and is bent upward and extends vertically in the inner tube 101b. A pipe 134 is connected to the $N_2$ gas supply source 125 and is also connected with a linear gas dispersion nozzle 135 made of quartz, which penetrates through the side walls of the manifold 103 and the inner tube 101b and leads to the interior of the processing container 101.

In the pipe 126 are disposed an opening/closing valve 126a and a flow rate controller 126b such as a mass flow controller on the upstream side of the opening/closing valve 126a. Similarly, in the pipes 128, 130, 132 and 134 are respectively disposed opening/closing valves 128a, 130a, 132a and 134a and flow rate controllers 128b, 130b, 132b and 134b.

A plurality of gas discharge holes 127a, 129a, 131a and 133a corresponding respectively to the wafers W are formed at predetermined intervals in vertical portions of the gas dispersion nozzles 127, 129, 131 and 133 over the length in the vertical direction corresponding to the wafer support range of the wafer boat 105 (only the gas discharge holes 133a are shown in FIG. 7). Thus, it is possible to discharge a gas substantially uniformly from the gas discharge holes 127a, 129a, 131a and 133a toward the wafer boat 105 in the horizontal direction.

Figure 9A:
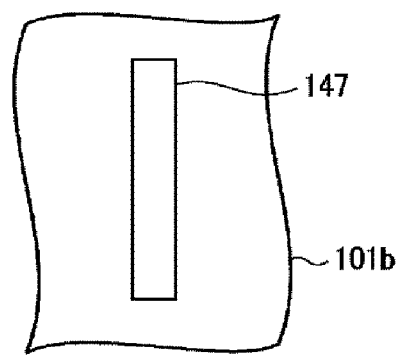
FIGS. 9A to 9C are views showing an example of a shape of an exhaust port formed in an inner tube of the apparatus of FIG. 7.
Figure 9B:
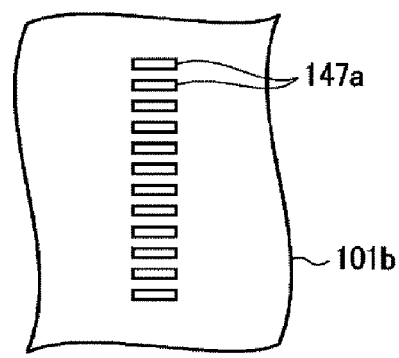
Figure 9C:
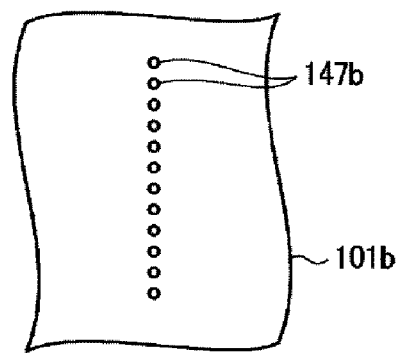

An exhaust opening 147 for evacuating the interior of the processing container 101 is installed in a portion of the inner tube 101b of the processing container 101 opposite to the arrangement position of the gas dispersion nozzles 127, 129, 131 and 133. As shown in FIG. 9A, the exhaust opening 147 is elongated vertically corresponding to the wafer boat 105. On the other hand, an exhaust port 111 is formed in the outer tube 101a of the processing container 101 in the vicinity of the exhaust opening 147, and an exhaust pipe 149 for exhausting the processing container 101 is connected to the exhaust port 111. A pressure control valve 150 for controlling the internal pressure of the processing container 101 and an exhaust device 151 including a vacuum pump and the like are connected to the exhaust pipe 149, and the interior of the processing container 101 is exhausted by the exhaust device 151 via the exhaust pipe 149. In place of the elongated exhaust opening 147 in FIG. 9A, slit-shaped exhaust openings 147a shown in FIG. 9B or hole-shaped exhaust openings 147b shown in FIG. 9C may be installed.

The processing container 101 and the wafers W placed in the processing container 101 are heated to a predetermined temperature when the heating mechanism 152 inside the main body section 102 described above is fed with power.

The processing apparatus 100 has a controller 160. The controller 160 controls various components of the processing apparatus 100, for example, valves, a mass flow controller as a flow rate controller, a drive mechanism such as an elevating mechanism, the heating mechanism 152, and the like. The controller 160 has a main control part having a CPU, an input device, an output device, a display device and a storage device. A storage medium storing a program for controlling a process to be executed by the processing apparatus 100, that is, a process recipe, is set in the storage device. The main control part calls the process recipe stored in the storage medium and controls the processing apparatus 100 to perform a predetermined process based on the called process recipe.

Next, a method of forming a $SiO_2$ film (blocking oxide film) using the processing apparatus 100 of the first example will be described.

A film forming process is performed as follows based on the process recipe stored in the storage medium in the controller 160.

First, a plurality of wafers W (for example, 50 to 150 wafers) having the structure shown in FIG. 1A are mounted on the wafer boat 105 in an atmospheric atmosphere, and the wafer boat 105 is inserted into the processing container 101 in the processing apparatus 100 from below to accommodate the plurality of wafers W into the inner tube 101b of the processing container 101. Then, the lower end opening portion of the manifold 103 is closed with the lid 109 to seal the inner space of the processing container 101.

Then, the interior of the processing container 101 is exhausted by the exhaust device 151 to set the internal pressure of the processing container 101 to a predetermined pressure in the range of 1 to 10 Torr (133 to 1,3331 Pa). At the same time, a $N_2$ gas as an inert gas is supplied from the $N_2$ gas supply source 125 into the processing container 101 to put the interior of the processing container 101 under a predetermined depressurized $N_2$ gas atmosphere, and the temperature of the wafers W is raised to a predetermined temperature in the range of 600 to 650 degrees C., for example, 630 degrees C., by the heating mechanism 152.

At the point of time when the temperature of the wafers W reaches the predetermined temperature, an operation for forming a spacer SiN film is repeated a predetermined number of times to form a spacer SiN film on the surfaces of the $SiO_2$ film and the SiN film of the wafers W by ALD. The operation for forming a spacer SiN film is described below. While the supply of the $N_2$ gas continues, a HCD gas is supplied from the HCD gas supply source 121 and passes through the pipe 126 and the gas dispersion nozzle 127, and then is supplied along the surfaces of the wafers W from the gas discharge hole 127a, such that the HCD gas is adsorbed on the surfaces of the wafers W. Next, the supply of HCD gas is stopped, the interior of the processing container 101 is purged with the $N_2$ gas, and an $NH_3$ gas is supplied from the $NH_3$ gas supply source 122 and passes through the pipe 128 and the gas dispersion nozzle 129, and then is supplied along the surfaces of the wafers W from the gas discharge hole 129a to nitride Si adsorbed on the wafers W. Next, the supply of $NH_3$ gas is stopped, and the interior of the processing container 101 is purged with the $N_2$ gas.

Next, a $N_2$ gas is supplied into the processing container 101 to purge the interior of the processing container 101, and the temperature of the wafer is raised to a predetermined temperature in the range of 800 to 900 degrees C. by the heating mechanism 152. Thereafter, an $O_2$ gas is supplied onto the wafers W from the $O_2$ gas supply source 123 through the pipe 130 and the gas dispersion nozzle 131, and a $H_2$ gas is supplied onto the wafers W from the $H_2$ gas supply source 124 through the pipe 132 and the gas dispersion nozzle 133, thereby generating O* and H* with the principle of LPRO by the high temperature of 800 to 900 degrees C. Thus, the spacer SiN film is substituted with a $SiO_2$ film (substitution $SiO_2$ film) by the thermal energy and these radicals.

Next, an operation for forming a blocking oxide film is repeated a predetermined number of times to form a film thickness adjusting $SiO_2$ film having a predetermined thickness on the substitution $SiO_2$ film by ALD. The operation for forming a blocking oxide film is described below. The interior of the processing container 101 is purged with the $N_2$ gas, the temperature of the wafer is controlled to a predetermined temperature in the range of 700 to 750 degrees C. while the $N_2$ gas is being supplied into the processing container 101. A HCD gas is supplied from the HCD gas supply source 121 and passes through the pipe 126 and the gas dispersion nozzle 127, and then is supplied along the surfaces of the wafers W from the gas discharge hole 127a, such that the HCD gas is adsorbed on the surfaces of the wafers W. Next, the supply of HCD gas is stopped, and the interior of the processing container 101 is purged with the $N_2$ gas. After that, an $O_2$ gas is supplied onto the wafers W from the $O_2$ gas supply source 123 through the pipe 130 and the gas dispersion nozzle 131, and a $H_2$ gas is supplied onto the wafers W from the $H_2$ gas supply source 124 through the pipe 132 and the gas dispersion nozzle 133, thereby generating O* and H* to cause the adsorbed Si to undergo low pressure radical oxidation (LPRO). Next, the supply of $O_2$ gas and $H_2$ gas is stopped, and the interior of the processing container 101 is purged with the $N_2$ gas. As such, by repeating the operation for forming a blocking oxide film a predetermined number of times, a blocking oxide film composed of the substitution $SiO_2$ film and the film thickness adjusting $SiO_2$ film is formed.

After completion of the above-described process, the interior of the processing container 101 is purged with a $N_2$ gas and is returned to the atmospheric pressure. Then, the wafer boat 105 is unloaded downward.

According to the processing apparatus of this example, since the steps S2 to S4 can be performed in-situ, a blocking oxide film having good quality can be formed with high productivity. In addition, it is possible to obtain a film thickness adjusting $SiO_2$ film having high quality and high wet etching resistance because of the high film forming temperature of 700 to 750 degrees C.

SECOND EXAMPLE OF PROCESSING APPARATUS

Figure 10:
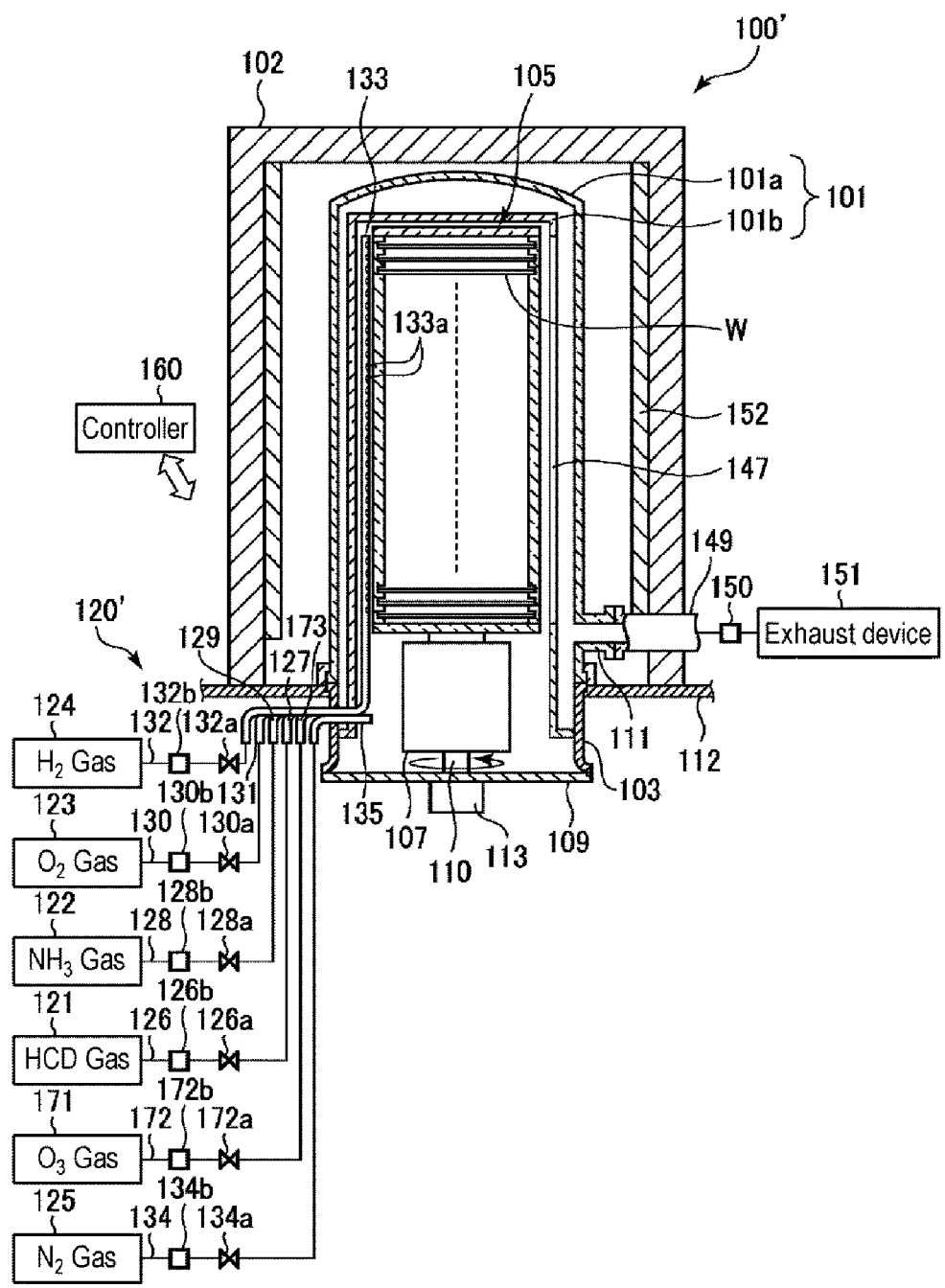
FIG. 10 is a longitudinal sectional view showing a second example of a processing apparatus capable of performing a method of forming a silicon oxide film according to the present disclosure.
Figure 11:
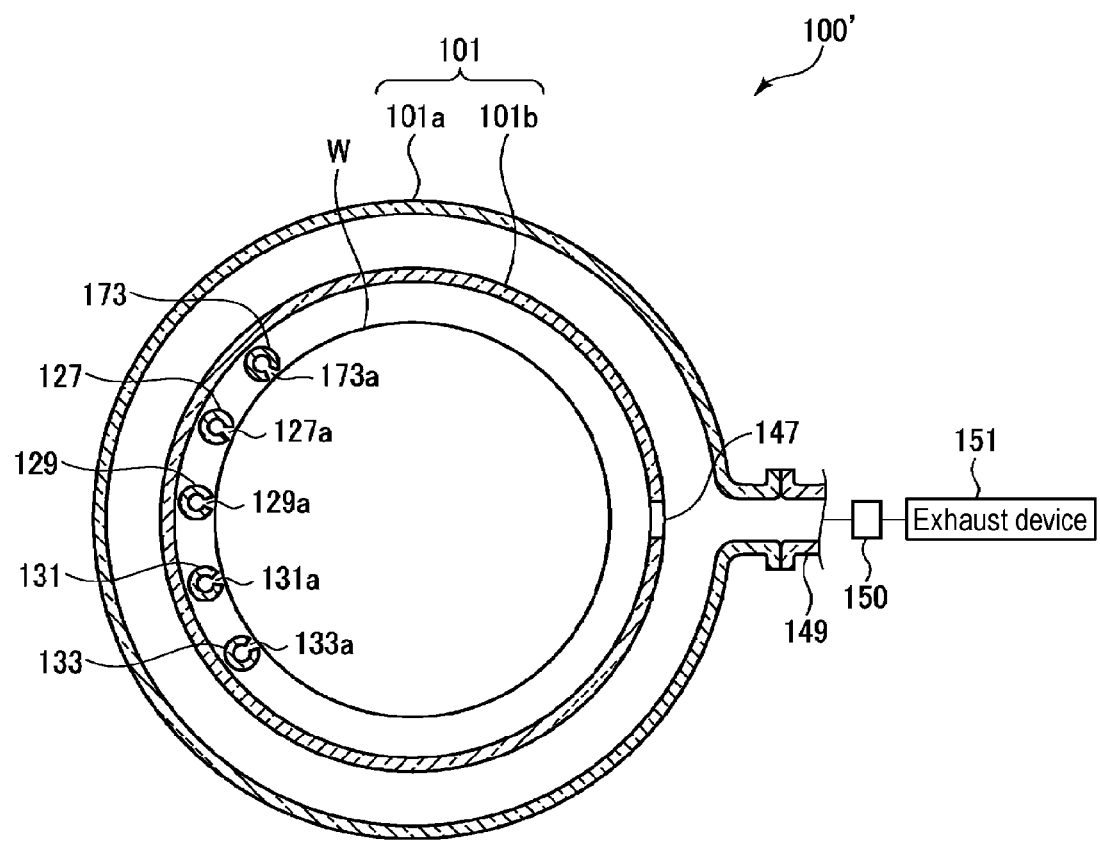
FIG. 11 is a horizontal sectional view showing a second example of a processing apparatus capable of performing a method of forming a silicon oxide film according to the present disclosure.

Next, a second example of the processing apparatus capable of performing the step S4 by the second method will be described. FIG. 10 is a longitudinal sectional view showing a second example of the processing apparatus. FIG. 11 is a horizontal sectional view of the second example of the processing apparatus.

A processing apparatus 100' of this example has basically the same configuration as the processing apparatus 100 of the first example except that the former has a gas supply mechanism 120' different from the gas supply mechanism 120 of the first example. In addition to the configuration of the gas supply mechanism 120, the gas supply mechanism 120' further includes an $O_3$ gas supply source 171, a pipe 172 connected to the $O_3$ gas supply source 171, and a gas dispersion nozzle 173 made of quartz, which is connected to the pipe 172 and is bent upward and extends vertically in the processing container 101 while penetrating through the side walls of the manifold 103 and the inner tube 101b. A plurality of gas discharge holes 173a corresponding respectively to the wafers W are formed at predetermined intervals in vertical portions of the gas dispersion nozzle 173 over the length in the vertical direction corresponding to the wafer support range of the wafer boat 105. In the pipe 172 are disposed an opening/closing valve 172a and a flow rate controller 172b such as a mass flow controller on the upstream side of the opening/closing valve 172a. Other configurations are the same as those of the processing apparatus 100 and therefore, explanation thereof will not be repeated for the purpose of brevity.

Next, a method of forming a $SiO_2$ film (blocking oxide film) using the processing apparatus 100' of the second example will be described.

In this example, the substitution $SiO_2$ film is formed in exactly the same way as in the processing apparatus 100.

In forming a film thickness adjusting $SiO_2$ film, an operation for forming a blocking oxide film is repeated a predetermined number of times to form a film thickness adjusting $SiO_2$ film having a predetermined thickness on the substitution $SiO_2$ film by ALD. The operation for forming a blocking oxide film according to the second method is described below. The interior of the processing container 101 is purged with a $N_2$ gas, the temperature of the wafer is controlled to a predetermined temperature in the range of 600 to 650 degrees C. while the $N_2$ gas is being supplied into the processing container 101. A HCD gas is supplied from the HCD gas supply source 121 and passes through the pipe 126 and the gas dispersion nozzle 127, and then is supplied along the surfaces of the wafers W from the gas discharge hole 127a, such that the HCD gas is adsorbed on the surfaces of the wafers W. Next, the supply of HCD gas is stopped, the interior of the processing container 101 is purged with the $N_2$ gas, and then an $O_3$ gas is supplied from the $O_3$ gas supply source 171 and passes through the pipe 172 and the gas dispersion nozzle 173, and then is supplied onto the wafers W to oxidize the adsorbed Si. Next, the supply of $O_3$ gas is stopped, and the interior of the processing container 101 is purged with the $N_2$ gas. As such, by repeating the operation for forming a blocking oxide film according to the second method a predetermined number of times, a blocking oxide film composed of the substitution $SiO_2$ film and the film thickness adjusting $SiO_2$ film is formed.

After completion of the above-described process, the interior of the processing container 101 is purged with a $N_2$ gas and is returned to the atmospheric pressure. Then, the wafer boat 105 is unloaded downward.

According to the processing apparatus of this example, since the steps S2 to S4 can be performed in-situ, a blocking oxide film having good quality can be formed with high productivity. In addition, since the film forming temperature of the film thickness adjusting $SiO_2$ film is lower than that of the first example, the wet etching resistance is inferior to that of the processing apparatus of the first example. However, since the amount of H contained in the film may be made smaller than that in the first example, the dry etching resistance can be increased.

Other Applications

While the embodiments of the present disclosure have been described above, the present disclosure is not limited to the above-described embodiments but various modifications can be made without departing from the spirit and scope of the present disclosure.

For example, it has been illustrated in the above-described embodiments that, when a 3D-NAND type nonvolatile semiconductor device is formed, the present disclosure is applied to a case where a blocking oxide film is formed on the exposed surfaces of the $SiO_2$ film and the SiN film of the memory holes formed in the laminated film of the $SiO_2$ film and the SiN film. However, the present disclosure is not limited thereto but can be applied to any case as long as it is possible to form a $SiO_2$ film uniformly on the surfaces of the $SiO_2$ film and the SiN film.

In addition, it has been illustrated in the above-described embodiments that the spacer SiN film is formed by ALD. However, without being limited to ALD, the spacer SiN film may be formed by other methods such as CVD or the like. In addition, it has been illustrated in the above-described embodiments that the film thickness adjusting $SiO_2$ film is formed by ALD. However, without being limited to ALD, the film thickness adjusting $SiO_2$ film may be formed by other methods such as CVD or the like.

Further, it has been illustrated in the above-described embodiments that a vertical batch type apparatus is used as the processing apparatus. However, the present disclosure is not limited thereto but may be applied to a horizontal batch type apparatus, a single wafer type apparatus and a semi-batch type apparatus in which a plurality of workpieces are placed and processed on a rotary table.

According to the present disclosure in some embodiments, since a silicon nitride film is first formed on a target surface on which a silicon oxide film and a silicon nitride film are exposed and then is substituted with a silicon oxide film, it is possible to suppress generation of a grown oxide and to form a thin silicon oxide film having a uniform film thickness.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon oxide film on a target surface on which a silicon oxide film and a silicon nitride film are exposed, comprising:
    placing a workpiece having the target surface on which the silicon oxide film and the silicon nitride film are exposed, in a processing container under a depressurized atmosphere;
    forming a spacer silicon nitride film to be a sacrificial film on the target surface on which the silicon oxide film and the silicon nitride film are exposed; and
    substituting the spacer silicon nitride film with a substitution silicon oxide film by supplying thermal energy, oxygen radicals and hydrogen radicals onto the workpiece,
    wherein in the forming a spacer silicon nitride film, the spacer silicon nitride film is formed by ALD (Atomic Layer Deposition) by alternately supplying a silicon precursor gas and a nitriding gas.

2. The method of claim 1, wherein in the substituting the spacer silicon nitride film, the oxygen radicals and the hydrogen radicals are generated by supplying an oxygen gas and a hydrogen gas while heating the workpiece to a temperature in the range of 800 to 900 degrees C.

3. The method of claim 1, wherein in the forming a spacer silicon nitride film, a chlorine-containing silane-based gas as the silicon precursor gas and an ammonia gas as the nitriding gas are supplied to the workpiece.

4. The method of claim 1, further comprising: after the substituting the spacer silicon nitride film, forming a film thickness adjusting silicon oxide film on the substitution silicon oxide film.

5. The method of claim 4, wherein in the forming a film thickness adjusting silicon oxide film, the film thickness adjusting silicon oxide film is formed by ALD by alternately supplying a silicon precursor gas and oxidizing species.

6. The method of claim 5, wherein in the forming a film thickness adjusting silicon oxide film, oxygen radicals and hydrogen radicals, which are generated by supplying an oxygen gas and a hydrogen gas while heating the workpiece to 700 to 750 degrees C., are supplied to the workpiece as the oxidizing species.

7. The method of claim 5, wherein in the forming a film thickness adjusting silicon oxide film, an ozone gas is supplied as the oxidizing species.

8. The method of claim 5, wherein in the forming a film thickness adjusting silicon oxide film, a chlorine-containing silane-based gas is supplied as the silicon precursor gas.

9. The method of claim 1, wherein the target surface on which the silicon oxide film and the silicon nitride film are exposed is a surface of a laminated film of the silicon oxide film and the silicon nitride film as a sacrificial film, which is exposed in a memory hole formed in the laminated film in the laminating direction, in a semiconductor wafer forming a 3D-NAND type nonvolatile semiconductor device as the workpiece, and the silicon oxide film formed on the target surface is a blocking oxide film.

10. A non-transitory computer-readable storage medium storing a program that is operated on a computer and controls an apparatus for forming a silicon oxide film on a target surface on which a silicon oxide film and a silicon nitride film are exposed,
wherein the program is executed to cause the computer to control the apparatus to perform the method of claim 1.

11. An apparatus for forming a silicon oxide film on a target surface on which a silicon oxide film and a silicon nitride film are exposed, comprising:
- a processing container in which a workpiece having the target surface on which the silicon oxide film and the silicon nitride film are exposed is accommodated;
- a gas supply part configured to supply a predetermined gas into the processing container;
- a heating mechanism configured to heat an interior of the processing container;
- an exhaust mechanism configured to exhaust the interior of the processing container to bring the processing container into a depressurized state; and
- a controller configured to control the gas supply part, the heating mechanism and the exhaust mechanism,
- wherein the controller controls the gas supply part, the heating mechanism and the exhaust mechanism to perform a process including:
- keeping the interior of the processing container under a predetermined depressurized atmosphere in a state where the workpiece is placed in the processing container;
- forming a spacer silicon nitride film to be a sacrificial film on the target surface on which the silicon oxide film and the silicon nitride film are exposed by supplying a silicon precursor gas and a nitriding gas; and
- substituting the spacer silicon nitride film with a substitution silicon oxide film by supplying thermal energy, oxygen radicals and hydrogen radicals onto the workpiece.

12. The apparatus of claim 11, wherein, when the spacer silicon nitride film is substituted with the substitution silicon oxide film, the controller performs control to generate the oxygen radicals and the hydrogen radicals by supplying an oxygen gas and a hydrogen gas while heating the workpiece to a temperature in the range of 800 to 900 degrees C., and to substitute the spacer silicon nitride film with the substitution silicon oxide film by the oxygen radicals and the hydrogen radicals.

13. The apparatus of claim 11, wherein, when the spacer silicon nitride film is formed, the controller performs control to form the spacer silicon nitride film by ALD by alternately supplying a chlorine-containing silane-based gas as the silicon precursor gas and an ammonia gas as the nitriding gas.

14. The apparatus of claim 11, wherein, after substituting the spacer silicon nitride film with the substitution silicon oxide film, the controller performs control to form a film thickness adjusting silicon oxide film by ALD by alternately supplying the silicon precursor gas and oxidizing species.

15. The apparatus of claim 14, wherein, when the film thickness adjusting silicon oxide film is formed, the controller performs control to generate oxygen radicals and hydrogen radicals by supplying an oxygen gas and a hydrogen gas while heating the workpiece to 700 to 750 degrees C. such that the oxygen radicals and the hydrogen radicals are supplied as the oxidizing species.

16. The apparatus of claim 14, wherein, when the film thickness adjusting silicon oxide film is formed, the gas supply part supplies an ozone gas as the oxidizing species.

* * * * *